(12) United States Patent
Best et al.

(10) Patent No.: US 10,871,807 B2
(45) Date of Patent: Dec. 22, 2020

(54) POWER DISTRIBUTION SYSTEM WITH THERMAL CUTOFF FOR DIELECTRIC COOLING SYSTEMS

(71) Applicant: Green Revolution Cooling, Inc., Austin, TX (US)

(72) Inventors: Christiaan Best, Lake Charles, LA (US); Alex McManis, Austin, TX (US); Ronald F. Slezak, Austin, TX (US)

(73) Assignee: GREEN REVOLUTION COOLING, INC., Austin, TX (US)

(\*) Notice: Subject to any disclaimer, the term of this patent is extended or adjusted under 35 U.S.C. 154(b) by 232 days.

(21) Appl. No.: 16/042,532

(22) Filed: Jul. 23, 2018

(65) Prior Publication Data

US 2019/0025894 A1    Jan. 24, 2019

Related U.S. Application Data

(60) Provisional application No. 62/604,827, filed on Jul. 24, 2017.

(51) Int. Cl.
| | | |
|---|---|---|
| *G05F 1/20* | (2006.01) | |
| *G06F 1/20* | (2006.01) | |
| *H05K 7/14* | (2006.01) | |
| *H05K 7/20* | (2006.01) | |

(52) U.S. Cl.
CPC ............ *G06F 1/20* (2013.01); *H05K 7/1492* (2013.01); *H05K 7/20* (2013.01); *H05K 7/20236* (2013.01); *G06F 2200/201* (2013.01)

(58) Field of Classification Search
CPC . G06F 1/20; G06F 1/203; G06F 1/206; G06F 2200/201; H05K 7/1492; H05K 7/20; H05K 7/1485; H05K 7/20236; H05K 7/20218
See application file for complete search history.

(56) References Cited

U.S. PATENT DOCUMENTS

| | | | | |
|---|---|---|---|---|
| 4,147,207 | A | * | 4/1979 | Lesyk ................ F24H 3/002 165/104.33 |
| 2003/0143958 | A1 | * | 7/2003 | Elias ................. H01L 23/3733 455/73 |
| 2006/0011808 | A1 | * | 1/2006 | Li .................... H01L 27/14685 250/208.1 |
| 2007/0133147 | A1 | * | 6/2007 | Ritter .................. H01G 4/30 361/306.3 |
| 2007/0267741 | A1 | * | 11/2007 | Attlesey ............ H05K 7/20263 257/714 |
| 2010/0097040 | A1 | | 4/2010 | Boisvert et al. |
| 2010/0328889 | A1 | | 12/2010 | Campbell et al. |
| 2012/0089267 | A1 | * | 4/2012 | Jewell ............... H02J 13/0079 700/295 |

(Continued)

OTHER PUBLICATIONS

International Preliminary Report on Patentability (Chapter 1 of the Patent Cooperation Treaty) received from the International Bureau of WIPO in related International Application No. PCT/US2018/043484 dated Feb. 6, 2020.

(Continued)

*Primary Examiner* — Adolf D Berhane
(74) *Attorney, Agent, or Firm* — The Marbury Law Group, PLLC

(57) ABSTRACT

A power distribution unit for a dielectric cooling system comprising a thermal cutoff or a float switch.

18 Claims, 2 Drawing Sheets

(56) References Cited

U.S. PATENT DOCUMENTS

| | | |
|---|---|---|
| 2014/0218858 A1 | 8/2014 | Shelnutt et al. |
| 2015/0382515 A1 | 12/2015 | James et al. |
| 2017/0244141 A1* | 8/2017 | Weicker .............. H01M 10/625 |
| 2018/0199427 A1* | 7/2018 | Miyahara .............. H05K 1/0269 |
| 2019/0198959 A1* | 6/2019 | Ashida .................. H01P 1/2039 |
| 2019/0199313 A1* | 6/2019 | Ashida .................... H01L 23/66 |
| 2019/0326654 A1* | 10/2019 | Ashida ...................... H01P 1/18 |

OTHER PUBLICATIONS

International Search Report and Written Opinion for PCT/US18/43484, dated Nov. 7, 2018.

* cited by examiner

POWER DISTRIBUTION SYSTEM WITH THERMAL CUTOFF FOR DIELECTRIC COOLING SYSTEMS

CROSS REFERENCE TO RELATED PATENT APPLICATION

This application claims the benefit of U.S. Provisional Application No. 62/604,827, filed Jul. 24, 2017.

FIELD

The present invention is directed to dielectric cooling systems and specifically to a power distribution system for a dielectric cooling system.

BACKGROUND

Building data centers is expensive, costing up to $2000 per server by some estimates at today's prices. Power distribution is also expensive, resulting in more than ⅓ of the cost of building a data center. Most of this power distribution cost is related to the labor of installation. Oil submersion cooling supports high power densities in each rack, with up to 60 kW per rack or higher. Commercial Off-The-Shelf (COTS) designs use 208 VAC, 3 phase input, normally limited to 60 amps. At 100% of breaker rating, this results in a maximum power rating per power distribution unit (PDU) of 17.3 kW. To have a power capacity that matches the cooling capacity of a standard rack, 4 PDU's are typically required. If redundant power is required, 8 PDU's are typically required.

At these power levels, the rack can hold 250 servers or more, each server having 4 or more cables (e.g., 2 power cables and 2 communication cables). Even without redundancy, the result is 1000 cables, 250 going to 4 different locations. This large number of cables results in a confusion of wires that is hard to organize and keep straight. Further, each PDU requires significant space for mounting.

Additionally, cooling systems often fail in data centers. The most common source of the failure is human error. When using dielectric liquid cooling (oil) with conventional PDU's, if the cooling fails the computers continue to dissipate heat into the dielectric liquid. The dielectric liquid increases in temperature until the computers shut themselves off or a human manually turns off the servers. If the dielectric oil gets hot enough, the hot dielectric oil can become a safety issue either by being hot enough to ignite or hot enough to burn the skin.

Further, the cost of installing electrical equipment in a data center is high. On average, it requires $9 of labor to install every $1 worth of equipment.

SUMMARY

An embodiment is drawn to a power distribution unit for a dielectric cooling system comprising a thermal cutoff or a float switch.

Another embodiment is drawn to a dielectric cooling system including a tank having dielectric fluid therein and a power distribution unit having a thermal cutoff. The thermal cutoff is configured to cutoff power to electronic devices located in the tank if a temperature of the dielectric fluid exceeds a threshold value.

DETAILED DESCRIPTION

Figure 1:
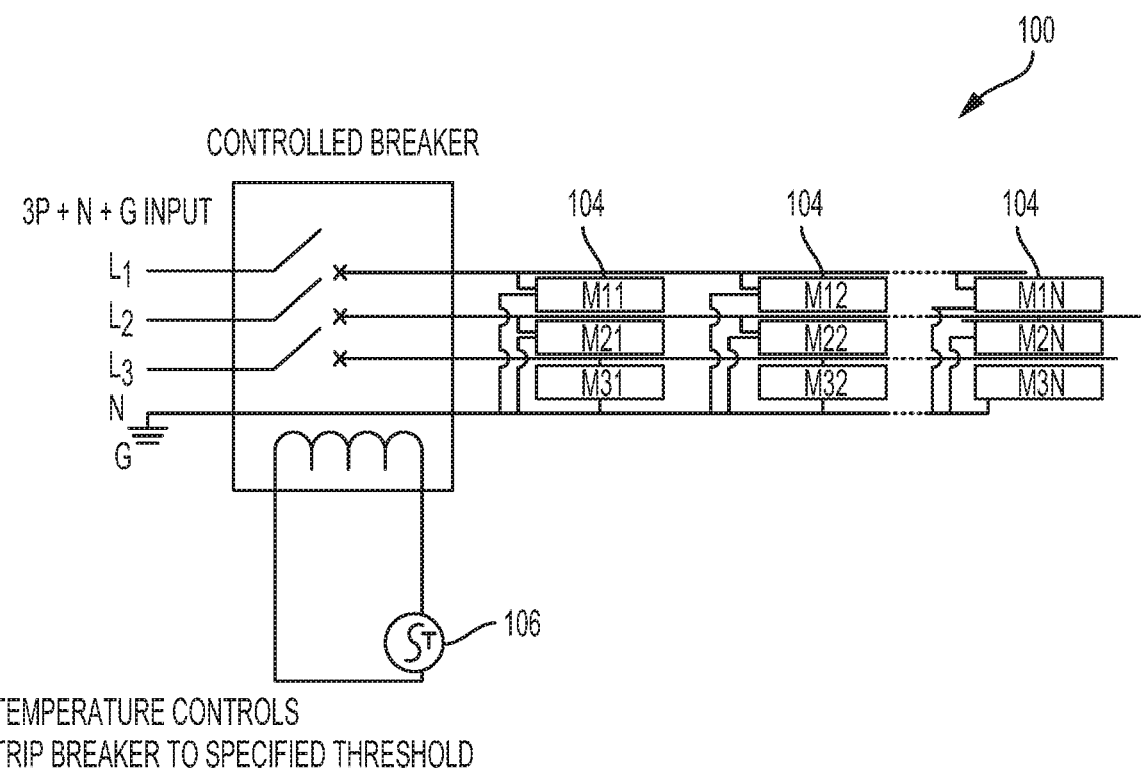
FIG. 1 is a schematic diagram of a power distribution unit with a thermal cutoff according to an embodiment.

An embodiment of a power distribution unit is illustrated in FIG. 1. In this embodiment, the PDU 100 has a 415 VAC 5 wire (3 hot wires $L_1$, $L_2$, $L_3$, a neutral N and ground G) input, branched out with 240 VAC between each hot phase $L_1$, $L_2$, $L_3$ and the neutral/ground N, G. This embodiment runs at a higher voltage than a conventional PDU. Running at higher voltage has a number of advantages. One advantages includes the use of fewer PDUs 100 for the same current level. The reduction of PDUs 100 for each rack results in fewer wires at each rack, because fewer breakers are used. Additionally, fewer wires results and fewer breakers results in lower installation cost.

Some embodiments have configurations with a higher input amperage than conventional systems, such as 80 to 100 amps or more. As illustrated in FIG. 1, each outlet 104 is preferably wired from hot $L_1$, $L_2$, $L_3$ to neutral N with 20 amp sub-breakers linked to a set of C13 or similar outlets. This results in 240 VAC to the server power supplies. In an embodiment, the PDU has a main shutoff 106. The main shutoff 106 may be an insulated-gate bipolar transistor (IGBT), solid state relay, mechanic relay, smart breaker, or similar device.

Figure 2:
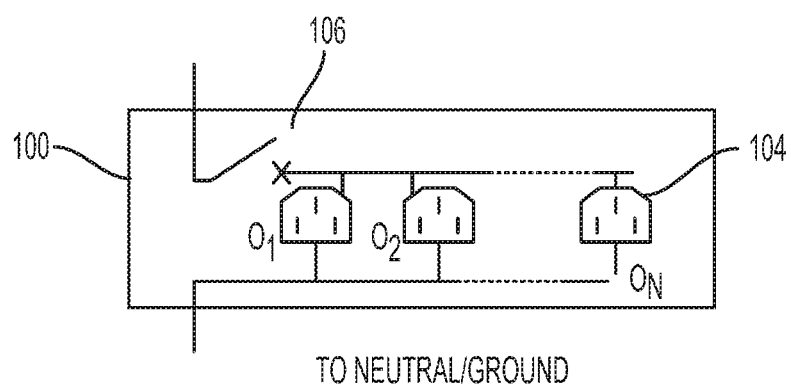
FIG. 2 is a plan view of a PDU according to an embodiment.

FIG. 2 is a plan view of a PDU 100 according to an embodiment. As illustrated, the PDU 100 is generally rectangular in shape and includes a plurality of outlets 104 which provide power to electrical components, such as servers. The neutral wire N of the PDU 100 is connected to ground G. The main shutoff 106 is illustrated as a simple switch, however, as discussed above, the main shutoff 106 may be an insulated-gate bipolar transistor (IGBT), solid state relay, mechanic relay, smart breaker, or similar device.

Figure 3:
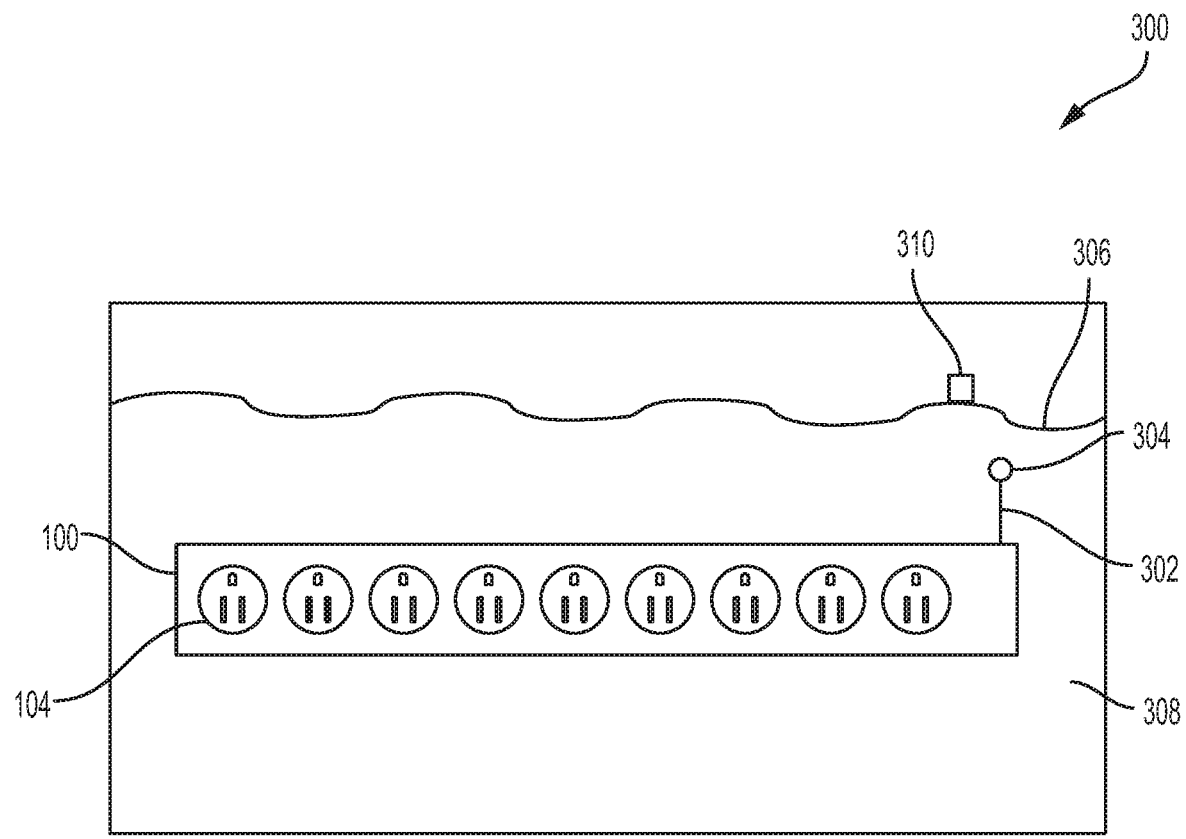
FIG. 3 is a schematic diagram of a dielectric cooling system according to an embodiment.

FIG. 3 illustrates a dielectric cooling system 300 according to an embodiment. Specifically, this embodiment is drawn to a dielectric cooling system 300 with a PDU 100 having a thermal cutoff as discussed above. The PDU 100 with a thermal cutoff ensures that if any failure occurred in the cooling system, power would be cut off from the servers. This embodiment of a cooling system exhibits enhanced safety over a conventional system lacking an automatic shutoff. This feature may also assist with safety certifications.

In an embodiment, a low voltage signal wire 302 exits the PDU 100 and is connected to a temperature sensor 304 located below the surface 306 of the dielectric oil 308. In an embodiment, the temperature sensor 304 is located several inches below the surface 306 of the dielectric oil 308, such as 2-24 inches, such as 4-20 inches, such as 6-18 inches. The temperature sensor 304 may be a digital on/off or a thermal fuse, breaking the circuit when the oil temperature 308 exceeds a threshold value. In an embodiment, the low voltage circuit may be tied to a "pull in" signal of the main shutoff 106. If the oil temperature exceeds the threshold value, power is cut to the PDU 100.

In some embodiments, the temperature sensor 304 is combined or replaced with a float switch 310. The float switch 310 ensures that if the level of the dielectric oil is below a certain value, power is cut off to the rack. The design may be used with air cooling with the temperature cutoff mounted in air.

In an embodiment, the length of the PDU 100 may be customized to match the length of the rack. In this embodiment, the cables do not run across the rack and the cable lengths may be as short as possible.

Although the foregoing refers to particular preferred embodiments, it will be understood that the invention is not so limited. It will occur to those of ordinary skill in the art that various modifications may be made to the disclosed embodiments and that such modifications are intended to be within the scope of the invention. All of the publications, patent applications and patents cited herein are incorporated herein by reference in their entirety.

What is claimed is:

1. A power distribution unit for controlling a dielectric cooling system having a tank that contains a dielectric coolant and electronic devices therein, the power distribution unit comprising:
   a thermal cutoff configured to cutoff power to the electronic devices located in the tank in response to detecting that a temperature of the dielectric fluid exceeds a threshold value; and
   an outlet configured to supply power to the electronic devices, wherein the outlet is wired to the thermal cutoff with at least 3 hot wires and a ground wire.

2. The power distribution unit of claim 1, wherein the power distribution unit has an input voltage of 415 VAC and 240 VAC between each hot wire and the ground wire.

3. The power distribution unit of claim 1, wherein the power distribution unit has an input current greater than or equal to 80 amps.

4. The power distribution unit of claim 3, wherein the power distribution unit has an input current greater than or equal to 100 amps.

5. The power distribution unit of claim 1, wherein the power distribution unit has an input current between 80 and 100 amps.

6. The power distribution unit of claim 1, further comprising a main power shutoff configured to cutoff power to the electronic devices.

7. The power distribution unit of claim 6, wherein the main power shutoff comprises an insulated-gate bipolar transistor (IGBT).

8. The power distribution unit of claim 1, wherein the thermal cutoff comprises a digital on/off.

9. A dielectric cooling system comprising:
   a tank configured to contain dielectric cooling fluid therein;
   a temperature sensor for detecting a temperature of the dielectric cooling fluid; and
   a power distribution unit having a thermal cutoff and an outlet, wherein the thermal cutoff is configured to cutoff power to electronic devices located in the tank in response to the temperature sensor detecting that the temperature of the dielectric cooling fluid exceeds a threshold value, wherein the outlet is configured to supply power to the electronic devices and the outlet is wired to the thermal cutoff with at least 3 hot wires and a ground wire.

10. The power distribution unit of claim 6, wherein the main power shutoff comprises a solid state relay.

11. The power distribution unit of claim 6, wherein the main power shutoff comprises a mechanic relay.

12. The power distribution unit of claim 6, wherein the main power shutoff comprises a smart breaker.

13. The power distribution unit of claim 1, wherein the thermal cutoff comprises a thermal fuse.

14. A power distribution unit for controlling a dielectric cooling system having a tank that contains a dielectric coolant and electronic devices therein, the power distribution unit comprising:
   a float switch configured to cutoff power to the electronic devices located in the tank in response to detecting that the dielectric fluid is below a threshold level; and
   an outlet configured to supply power to the electronic devices, wherein the outlet is wired to the float switch with at least 3 hot wires and a ground wire.

15. The dielectric cooling system of claim 9, wherein the power distribution unit has an input voltage of 415 VAC and 240 VAC between each hot wire and the ground wire.

16. The power distribution unit of claim 9, further comprising a main power shutoff configured to cutoff power to the electronic devices.

17. The power distribution unit of claim 16, wherein the main power shutoff comprises a solid state relay.

18. The power distribution unit of claim 16, wherein the main power shutoff comprises a mechanic relay.

* * * * *